US012500069B2

(12) United States Patent
Mikhnenko et al.

(10) Patent No.: US 12,500,069 B2
(45) Date of Patent: Dec. 16, 2025

(54) METHOD OF MOUNTING WIRES TO SUBSTRATE SUPPORT CERAMIC

(71) Applicant: LAM RESEARCH CORPORATION, Fremont, CA (US)

(72) Inventors: Oleksandr Mikhnenko, San Diego, CA (US); Quan Chau, Kamuela, HI (US)

(73) Assignee: LAM RESEARCH CORPORATION, Fremont, CA (US)

( * ) Notice: Subject to any disclaimer, the term of this patent is extended or adjusted under 35 U.S.C. 154(b) by 450 days.

(21) Appl. No.: 18/010,322

(22) PCT Filed: Jul. 12, 2021

(86) PCT No.: PCT/US2021/041210
§ 371 (c)(1),
(2) Date: Dec. 14, 2022

(87) PCT Pub. No.: WO2022/015614
PCT Pub. Date: Jan. 20, 2022

(65) Prior Publication Data

US 2023/0253192 A1 Aug. 10, 2023

Related U.S. Application Data

(60) Provisional application No. 63/053,111, filed on Jul. 17, 2020.

(51) Int. Cl.
*H01J 37/32* (2006.01)
*C23C 16/46* (2006.01)

(52) U.S. Cl.
CPC ........ *H01J 37/32715* (2013.01); *C23C 16/46* (2013.01)

(58) Field of Classification Search
CPC ............... H01J 37/32715; C23C 16/46; C23C 16/4581; C23C 16/4586; H01L 24/00
(Continued)

(56) References Cited

U.S. PATENT DOCUMENTS 10,804,080 B2 10/2020 Aramaki et al.
2012/0097332 A1 4/2012 Lin et al.
(Continued)

FOREIGN PATENT DOCUMENTS

JP S50145489 A 12/1975
JP 2012235037 A 11/2012
(Continued)

OTHER PUBLICATIONS

Japanese Office Action for Japanese Application No. 2023-502890 dated Apr. 14, 2025.
(Continued)

*Primary Examiner* — Rodney G McDonald

(57) ABSTRACT

A substrate support assembly includes a baseplate, a ceramic plate arranged on the baseplate, and a plurality of wires. The ceramic plate includes a plurality of slots arranged on a side facing the baseplate and a plurality of electrically conducting terminals disposed in the plurality of slots, respectively. Each of the terminals includes a base portion connected to the ceramic plate, a second portion extending from the base portion towards the baseplate, and an opening in the second portion extending from an end of the second portion adjacent to the base portion to a distal end of the second portion. Each of the wires passes through the opening of the respective terminal and is braided around the distal end of the second portion of the respective terminal.

22 Claims, 9 Drawing Sheets

(58) Field of Classification Search
USPC ................. 118/728; 204/298.15; 156/345.51
See application file for complete search history.

(56) References Cited

U.S. PATENT DOCUMENTS

| | | | |
|---|---|---|---|
| 2012/0247678 | A1 | 10/2012 | Takahashi et al. |
| 2017/0040148 | A1 | 2/2017 | Augustino et al. |

FOREIGN PATENT DOCUMENTS

| | | | |
|---|---|---|---|
| JP | 2019114591 | A | 7/2019 |
| KR | 20180137877 | A | 12/2018 |
| WO | WO-2019181525 | A1 | 9/2019 |

OTHER PUBLICATIONS

International Search Report and Written Opinion of the ISA issued in PCT/US2021/041210, mailed Oct. 29, 2021; ISA/KR.

Gas Source
Valve
MFC
Vapor Delivery System
RF Generator
Matching and Distribution Network
Controller
Temp Controller
Fluid Delivery System
Valve
Pump
100
102
104
106
108
110
112
114
116
118
120
122
124
130
132-1
132-2
132-N
134-1
134-2
134-N
136-1
136-2
136-N
140
142
150
152
154
156
158
160

METHOD OF MOUNTING WIRES TO SUBSTRATE SUPPORT CERAMIC

CROSS-REFERENCE TO RELATED APPLICATIONS

This application is a U.S. National Phase Application under 35 U.S.C. 371 of International Application No. PCT/US2021/041210, filed on Jul. 12, 2021, which claims the benefit of U.S. Provisional Application No. 63/053,111, filed on Jul. 17, 2020. The entire disclosures of the applications referenced above is are incorporated herein by reference.

FIELD

The present disclosure relates generally to substrate processing systems and more particularly to a method of mounting wires to substrate support ceramic.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A substrate processing system typically includes several processing chambers (also called process modules) to perform deposition, etching, and other treatments of substrates such as semiconductor wafers. Examples of processes that may be performed on a substrate include, but are not limited to, plasma enhanced chemical vapor deposition (PECVD), chemically enhanced plasma vapor deposition (CEPVD), sputtering physical vapor deposition (PVD), atomic layer deposition (ALD), and plasma enhanced ALD (PEALD). Additional examples of processes that may be performed on a substrate include, but are not limited to, etching (e.g., chemical etching, plasma etching, reactive ion etching, etc.) and cleaning processes.

During processing, a substrate is arranged on a substrate support assembly such as a pedestal or an electrostatic chuck (ESC) arranged in a processing chamber of the substrate processing system. A robot typically transfers substrates from one processing chamber to another in a sequence in which the substrates are to be processed. During deposition, gas mixtures including one or more precursors are introduced into the processing chamber, and plasma is struck to activate chemical reactions. During etching, gas mixtures including etch gases are introduced into the processing chamber, and plasma is struck to activate chemical reactions. The processing chambers are periodically cleaned by supplying a cleaning gas into the processing chamber and striking plasma.

SUMMARY

A substrate support assembly comprises a baseplate, a ceramic plate arranged on the baseplate, and a plurality of wires. The ceramic plate includes a plurality of slots arranged on a side facing the baseplate and a plurality of electrically conducting terminals disposed in the plurality of slots, respectively. Each of the terminals includes a base portion connected to the ceramic plate, a second portion extending from the base portion towards the baseplate, and an opening in the second portion extending from an end of the second portion adjacent to the base portion to a distal end of the second portion. Each of the wires passes through the opening of the respective terminal and is braided around the distal end of the second portion of the respective terminal.

In another feature, each of the wires is looped one or more times around the distal end of the second portion of the respective terminal.

In another feature, the substrate support assembly further comprises an electrically bonding material deposited at the distal end of the second portion of each of the terminals.

In another feature, the openings of the terminals thermally decouple the respective wires from the ceramic plate during processing of a substrate.

In another feature, the electrically bonding material includes a solder material or an epoxy.

In another feature, the electrically bonding material is localized at the distal end of the second portion of each of the terminals.

In another feature, the electrically bonding material does not extend to the base portions of the terminals.

In another feature, the electrically bonding material does not fill the openings of the terminals.

In another feature, the base portions of the terminals are connected to electrical components disposed in the ceramic plate.

In another feature, the distal ends of the wires are routed through the baseplate and are connected to a circuit arranged along a side of the baseplate facing away from the ceramic plate.

In another feature, the circuit communicates through the wires with electrical components that are disposed in the ceramic plate and that are connected to the base portions of the terminals.

In another feature, each of the terminals is T-shaped, with a horizontal portion of T being the base portion of each of the terminals and a vertical portion of T being the second portion of each of the terminals.

In another feature, in each of the terminals, the second portion extends perpendicularly from the base portion.

In another feature, in each of the terminals, the second portion is longer than the base portion.

In another feature, in each of the terminals, the base portion and the second portion are cylindrical, and the base portion has a longer radius and shorter height than the second portion.

In another feature, each of the terminals is made of a material having a first coefficient of thermal expansion that is within a predetermined range of a second coefficient of thermal expansion of the ceramic plate.

In another feature, each of the terminals is made of tungsten and copper.

In another feature, each of the terminals is coated with nickel.

In another feature, each of the wires is made of a single strand of an electrically conducting material.

In another feature, each of the wires is made of multiple strands of an electrically conducting material.

In another feature, each of the wires is made of copper and is coated with silver.

In another feature, the electrically bonding material includes a first material comprising Sn, Ag, and Cu or a second material comprising Sn and Ag.

In still other features, a method of attaching wires to a ceramic plate of a substrate support assembly comprises arranging a plurality of slots on the ceramic plate on a side facing a baseplate of the substrate support assembly, and arranging a plurality of electrically conducting terminals in the plurality of slots, respectively. Each of the terminals includes a base portion, a second portion extending from the base portion towards the baseplate, and an opening in the second portion extending from an end of the second portion adjacent to the base portion to a distal end of the second portion. The method comprises connecting the base portions of the terminals to the ceramic plate. The method comprises connecting a plurality of wires to the distal ends of the second portions of the plurality of terminals by: threading each of the wires through the opening of the respective terminal, folding each of the wires around the distal end into two halves, looping each of the wires around the distal end, and in each of the wires, twisting the two halves around each other from the distal end of the second portion of the respective terminal to distal ends of the two halves.

In another feature, the method further comprises looping each of the wires a plurality of times around the distal end of the second portion of the respective terminal.

In another feature, the method further comprises depositing an electrically bonding material at the distal end of the second portion of each of the terminals.

In another feature, the method further comprises soldering each of the wires to the respective terminals until a solder material is deposited at the distal end of the second portion of each of the terminals and until the solder material permeates the loop around the distal end of the second portion of each of the terminals.

In other features, the method further comprises applying a solder paste to the distal end of the second portion of each of the terminals and to a portion of each of the wires proximate to the distal end of the second portion of each of the terminals. The method further comprises performing a reflow process on the ceramic plate until the solder paste is melted.

In another feature, the openings of the terminals thermally decouple the respective wires from the ceramic plate during processing of a substrate.

In another feature, the electrically bonding material includes a solder material or an epoxy.

In another feature, the method further comprises keeping the electrically bonding material localized at the distal ends of the second portions of each of the terminals.

In another feature, the method further comprises not extending the electrically bonding material to the base portions of the terminals.

In another feature, the method further comprises not filling the openings of the terminals with the electrically bonding material.

In another feature, the method further comprises connecting the base portions of the terminals to electrical components disposed in the ceramic plate by performing a reflow process on the ceramic plate.

In other features, the method further comprises routing the distal ends of the wires through a baseplate coupled to the ceramic plate and connecting the distal ends of the wires to a circuit arranged adjacent to the baseplate.

In another feature, each of the terminals is T-shaped, with a horizontal portion of T being the base portion of each of the terminals and a vertical portion of T being the second portion of each of the terminals.

In another feature, in each of the terminals, the second portion extends perpendicularly from the base portion.

In another feature, in each of the terminals, the second portion is longer than the base portion.

In another feature, in each of the terminals, the base portion and the second portion are cylindrical, and the base portion has a longer radius and shorter height than the second portion.

In another feature, each of the terminals is made of a material having a first coefficient of thermal expansion that is within a predetermined range of a second coefficient of thermal expansion of the ceramic plate.

In another feature, each of the terminals is made of tungsten and copper.

In another feature, each of the terminals is coated with nickel.

In another feature, each of the wires is made of a single strand of an electrically conducting material.

In another feature, each of the wires is made of multiple strands of an electrically conducting material.

In another feature, each of the wires is made of copper and is coated with silver.

In another feature, the electrically bonding material includes a first material comprising Sn, Ag, and Cu or a second material comprising Sn and Ag.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1A:
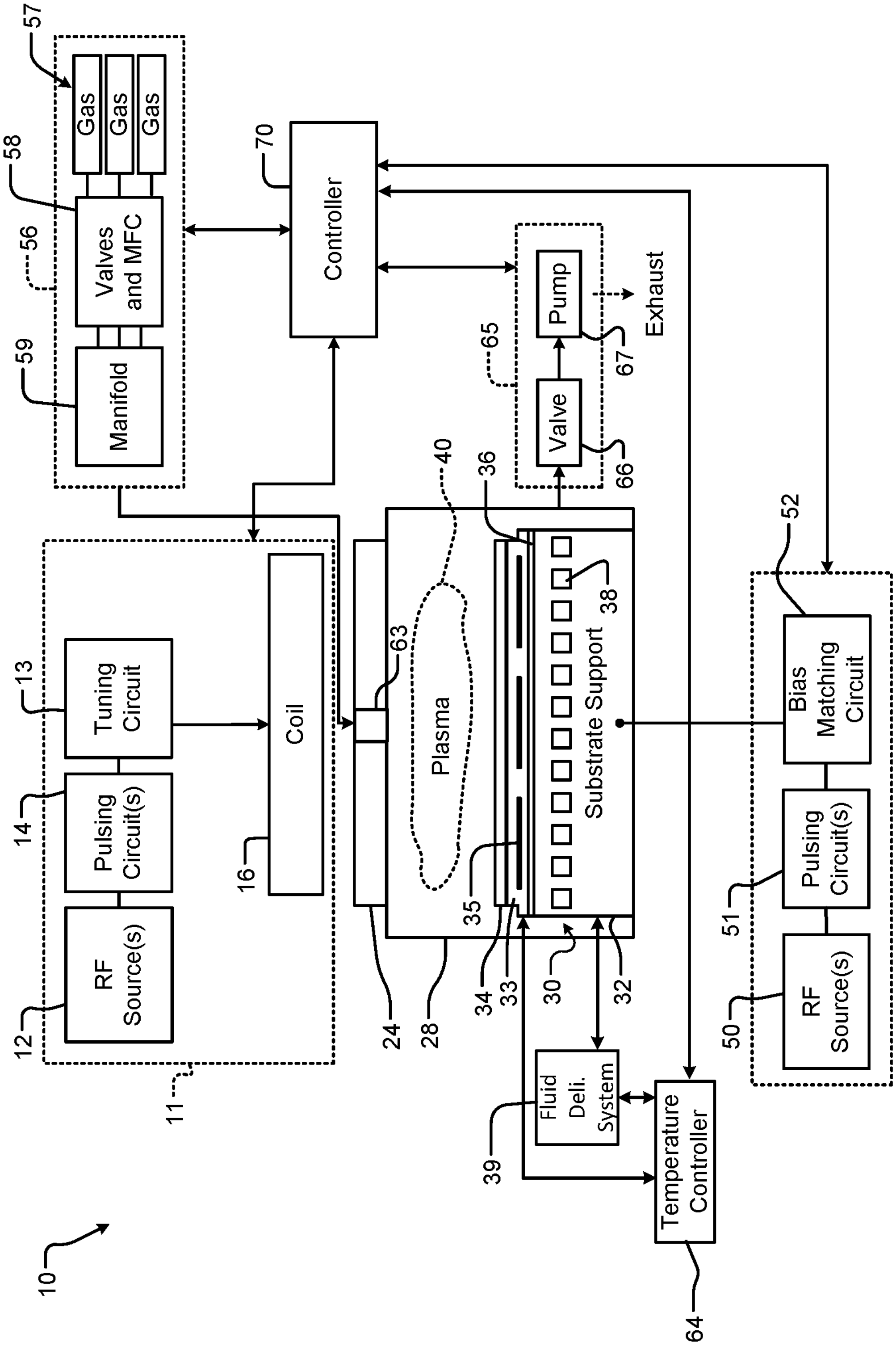
FIG. 1A shows a first example of a substrate processing system according to the present disclosure.

A substrate support assembly comprises a baseplate and a ceramic plate. The baseplate is made of a metal such as aluminum or a composite material comprising of plurality of different materials. The ceramic plate is arranged on the baseplate and includes several layers of a ceramic material. Various electrical components such as heaters, sensors, electrodes, and so on are disposed in the ceramic layers. These components are connected by wires extending from the ceramic plate and through the baseplate to a printed circuit board (PCB) arranged on a facility plate below the baseplate. The PCB is connected to a power supply and control circuit that is remote and external to the substrate support assembly. The PCB supplies signals from the sensors in the ceramic plate to the power supply and control circuit. Based on the signals, the power supply and control circuit supplies power and control signals to the components via the PCB.

Manufacturing connections between the wires and the ceramic plate poses significant challenges. Specifically, metallic terminals are disposed at the bottom of the ceramic plate. The terminals are connected to the components in the ceramic plate. Wires are soldered to the terminals. The wires are then routed through the baseplate and are connect to the PCB at the bottom of the baseplate. The wires are soldered to the terminals using either hand solder and/or reflow oven. This approach poses many challenges, especially when soldering is performed at high temperatures that are greater than 200 degrees Celsius.

In particular, when using a solder material that melts at greater than or equal to 270 degrees Celsius, the manual method of attaching the wires to the terminals using a soldering iron becomes impractical. While solder reflow process can be used instead, the solder reflow process requires complicated fixturing to support the wires that go into a reflow oven. Such fixturing creates problems related to manufacturing yield and part reliability.

For example, the reflow process needs to be performed at relatively higher temperatures and for relatively longer durations to accommodate the additional thermal mass of the fixture. Prolonged exposures at relatively high temperatures induces aging of the solder joints and promotes creation of intermetallic compounds, which weaken the solder joints and reduce the reliability of the solder joints during substrate processing. The soldering needs to be performed in an inert environment. The manual nature of this process results in manufacturing variability leading to frequent wire detachment issues and scrapping of the entire substrate support assembly, which is expensive.

Further, many substrate processes are performed at relatively high temperatures. The substrate support assemblies are subjected to a wide range of temperatures during substrate processing (e.g., from minus 20 degrees Celsius to 200 degrees Celsius). Consequently, maintaining mechanical stability and electrical contact between the wires and the ceramic plate during the lifetime of the substrate support assemblies also poses significant challenges.

The present disclosure provides a method for soldering a metallic terminal using a reflow process and then attaching the wire to the terminal in a specific manner described below in detail. The terminal is designed such that it has an opening through which a wire is threaded. After threading, the wire is folded such that the folding location is in the middle portion of the wire. Then the wire is twisted to ensure good mechanical stability and electrical contact with the terminal. Materials such as silver epoxy and/or solder are optionally used at the point of contact to enhance electrical contact of the wire with the terminal.

The advantage of this method is that the wire attachment can be performed reliably at much lower temperatures than the reflow process. This method guarantees electrical contact, mechanical strength, and high degree of manufacturability and repeatability. This method improves manufacturing yield and part reliability and repeatability in the field, which lowers the cost of the substrate support assemblies. These and other features of the present disclosure are described below in detail.

The present disclosure is organized as follows. Initially, examples of substrate processing systems in which substrate support assemblies manufactured according to the present disclosure can be used are shown and described with reference to FIGS. 1A and 1B. Thereafter, an example of a cross-section of a substrate support assembly is shown and described with reference to FIG. 2 to illustrate various electrical components disposed in a ceramic plate of the substrate support assembly. An example of a substrate support assembly comprising PCBs disposed at the bottom of a baseplate of the substrate support assembly is shown and described with reference to FIG. 3 to illustrate connections of various electrical components disposed in the ceramic plate of the substrate support assembly to the PCBs.

Subsequently, examples of metallic terminals disposed in a ceramic plate of a substrate support assembly and wires connected to the terminals are shown and described with reference to FIGS. 4A-5C. A new design of the terminals and examples of connecting wires in a novel manner to the new terminals according to the present disclosure are shown and described with reference to FIGS. 6A-6D. Examples of methods of soldering the wires to the terminals according to the present disclosure are shown and described with reference to FIGS. 7A-7B.

FIG. 1A shows an example of a substrate processing system 10 that uses inductively coupled plasma to etch substrates such as semiconductor wafers according to the present disclosure. The substrate processing system 10 includes a coil driving circuit 11. In some examples, the coil driving circuit 11 includes an RF source 12, a pulsing circuit 14, and a tuning circuit (i.e., matching circuit) 13. The pulsing circuit 14 controls a transformer coupled plasma (TCP) envelope of an RF signal generated by the RF source 12 and varies a duty cycle of TCP envelope between 1% and 99% during operation. The pulsing circuit 14 and the RF source 12 can be combined or separate.

The tuning circuit 13 may be directly connected to an inductive coil 16. While the substrate processing system 10 uses a single coil, some substrate processing systems may use a plurality of coils (e.g., inner and outer coils). The tuning circuit 13 tunes an output of the RF source 12 to a desired frequency and/or a desired phase, and matches an impedance of the inductive coil 16.

A dielectric window 24 is arranged along a top side of a processing chamber 28. The processing chamber 28 comprises a substrate support (or pedestal) 30 to support a substrate 34. The substrate support 30 may include an electrostatic chuck (ESC), or a mechanical chuck or other type of chuck. The substrate support 30 comprises a baseplate 32. A ceramic plate 33 is arranged on a top surface of the baseplate 32. A thermal resistance layer 36 may be arranged between the ceramic plate 33 and the baseplate 32. The substrate 34 is arranged on the ceramic plate 33 during processing.

A heater array 35 including a plurality of heaters is arranged in the ceramic plate 33 to heat the substrate 34 during processing. For example, the heater array 35 comprises printed resistive traces embedded in the ceramic plate 33. One or more additional heaters called zone heaters or primary heaters (not shown) may be arranged above or below the heater array 35. Additionally, while not shown, one or more temperature sensors may be disposed in the ceramic plate 33. Electrical connections to these components in the ceramic plate 33 are shown and described with reference to FIGS. 6A-6D.

The baseplate 32 further includes a cooling system 38 to cool the substrate support 30. The cooling system 38 uses a fluid supplied by a fluid delivery system 39 to cool the substrate support 30. For example, the cooling system 38 comprises cooling channels through which the fluid from the fluid delivery system 39 is flowed to cool the substrate support 30.

A process gas is supplied to the processing chamber 28, and plasma 40 is generated in the processing chamber 28. The plasma 40 etches an exposed surface of the substrate 34. An RF source 50, a pulsing circuit 51, and a bias matching circuit 52 may be used to bias the substrate support 30 during processing to control ion energy.

A gas delivery system 56 may be used to supply a process gas mixture to the processing chamber 28. The gas delivery system 56 may include process and inert gas sources 57, a gas metering system 58 such as valves and mass flow controllers, and a manifold 59. A gas injector 63 may be arranged at a center of the dielectric window 24 and is used to inject gas mixtures from the gas delivery system 56 into the processing chamber 28. Additionally or alternatively, the gas mixtures may be injected from the side of the processing chamber 28.

A temperature controller 64 may be connected to the heater array 35, the zone heaters, and the temperature sensors in the ceramic plate 33. The temperature controller 64 may be used to control the heater array 35 and the zone heaters to control a temperature of the substrate support 30 and the substrate 34. The temperature controller 64 may communicate with the fluid delivery system 39 to control fluid flow through the cooling system 38 to cool the substrate support 30.

An exhaust system 65 includes a valve 66 and pump 67 to control pressure in the processing chamber 28 and/or to remove reactants from the processing chamber 28 by purging or evacuation. A controller 70 may be used to control the etching process. The controller 70 controls the components of the substrate processing system 10. The controller 70 monitors system parameters and controls delivery of the gas mixture; striking, maintaining, and extinguishing the plasma; removal of reactants; supply of cooling fluid; and so on. Additionally, the controller 70 may control various aspects of the coil driving circuit 11, the RF source 50, and the bias matching circuit 52, and so on.

Figure 1B:
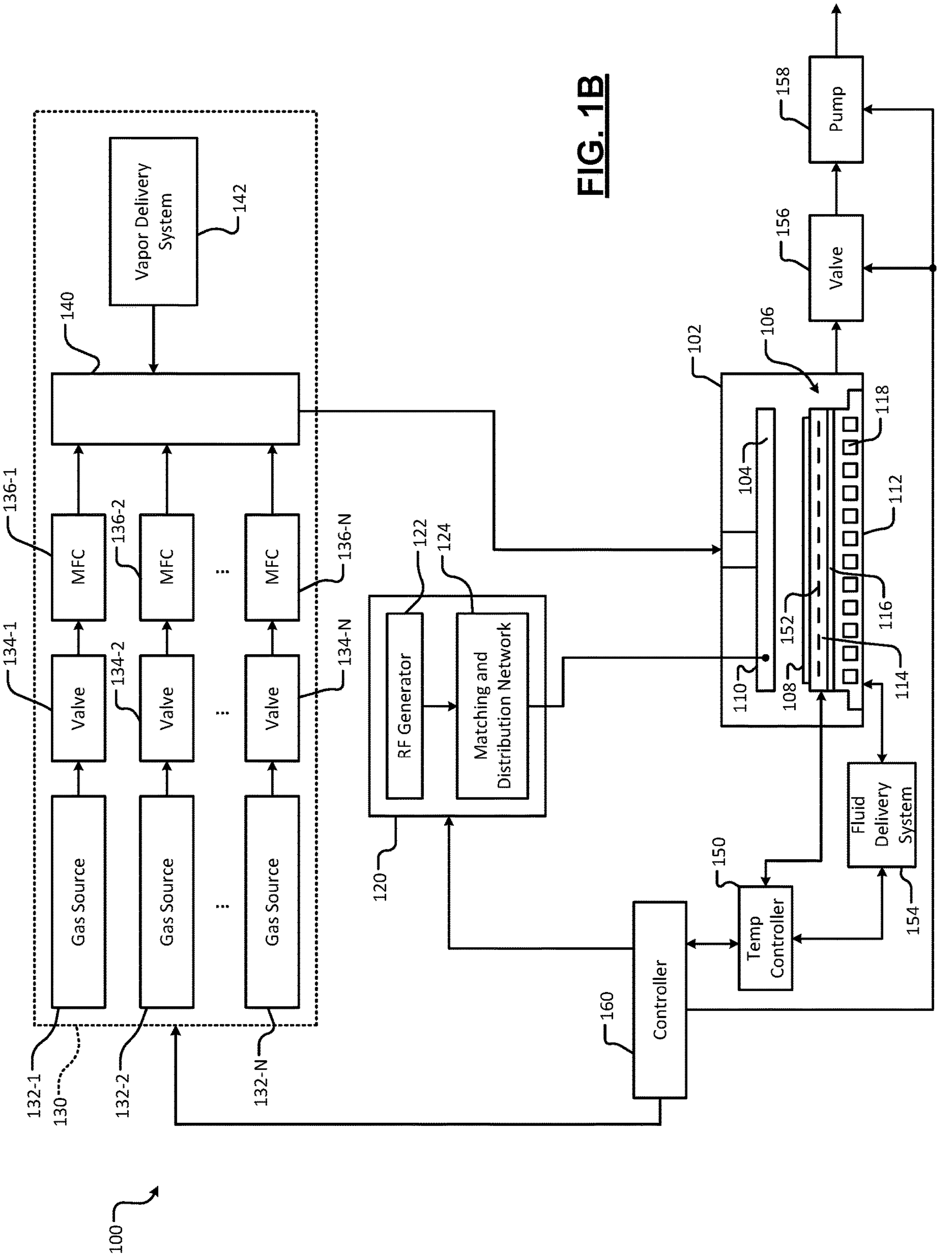
FIG. 1B shows a second example of a substrate processing system according to the present disclosure.

FIG. 1B shows another example of a substrate processing system 100 comprising a processing chamber 102 configured to generate capacitively coupled plasma. While the example is described in the context of plasma enhanced chemical vapor deposition (PECVD), the teachings of the present disclosure can be applied to other types of substrate processing such as atomic layer deposition (ALD), plasma enhanced ALD (PEALD), CVD, or also other processing including etching.

The substrate processing system 100 comprises the processing chamber 102 that encloses other components of the substrate processing system 100 and contains RF plasma (if used). The processing chamber 102 comprises an upper electrode 104 and an electrostatic chuck (ESC) 106 or other type of substrate support. During operation, a substrate 108 is arranged on the ESC 106.

For example, the upper electrode 104 may include a gas distribution device 110 such as a showerhead that introduces and distributes process gases into the processing chamber 102. The gas distribution device 110 may include a stem portion including one end connected to a top surface of the processing chamber 102. A base portion of the showerhead is generally cylindrical and extends radially outwardly from an opposite end of the stem portion at a location that is spaced from the top surface of the processing chamber 102. A substrate-facing surface or faceplate of the base portion of the showerhead includes a plurality of outlets or features (e.g., slots or through holes) through which vaporized precursor, process gas, cleaning gas, or purge gas flows.

The ESC 106 comprises a baseplate 112 that acts as a lower electrode. A ceramic plate 114 is arranged on a top surface of the baseplate 112. A thermal resistance layer 116 may be arranged between the ceramic plate 114 and the baseplate 112. The ceramic plate 114 includes a heater array 152 according to the present disclosure to heat the substrate 108. The heater array 152 comprises printed resistive traces embedded in the ceramic plate 114. One or more additional heaters called zone heaters or primary heaters (not shown) may be arranged above or below the heater array 152. Additionally, while not shown, one or more temperature sensors may be disposed in the ceramic plate 114.

The baseplate 112 further includes a cooling system 118 to cool the ESC 106. The cooling system 118 uses a fluid supplied by a fluid delivery system 154 to cool the ESC 106. For example, the cooling system 118 comprises cooling channels through which the fluid from the fluid delivery system 154 is flowed to cool the ESC 106.

If plasma is used, an RF generating system (or an RF source) 120 generates and outputs an RF voltage to one of the upper electrode 104 and the lower electrode (e.g., the baseplate 112 of the ESC 106). The other one of the upper electrode 104 and the baseplate 112 may be DC grounded, AC grounded, or floating. For example, the RF generating system 120 may include an RF generator 122 that generates RF power that is fed by a matching and distribution network 124 to the upper electrode 104 or the baseplate 112. In other examples, while not shown, the plasma may be generated inductively or remotely and then supplied to the processing chamber 102.

A gas delivery system 130 includes one or more gas sources 132-1, 132-2, . . . and 132-N (collectively gas sources 132), where N is an integer greater than zero. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. A vapor delivery system 142 supplies vaporized precursor to the manifold 140 or another manifold (not shown) that is connected to the processing chamber 102. An output of the manifold 140 is fed to the processing chamber 102. The gas sources 132 may supply process gases, cleaning gases, or purge gases.

A temperature controller 150 may be connected to the heater array 152, the zone heaters, and the temperature sensors in the ceramic plate 114. The temperature controller 150 may be used to control the heater array 152 and the zone heaters to control a temperature of the ESC 106 and the substrate 108. The temperature controller 150 may communicate with the fluid delivery system 154 to control fluid flow through the cooling system 118 to cool the ESC 106.

A valve 156 and pump 158 may be used to evacuate reactants from the processing chamber 102. A system controller 160 controls the components of the substrate processing system 100.

Figure 2:
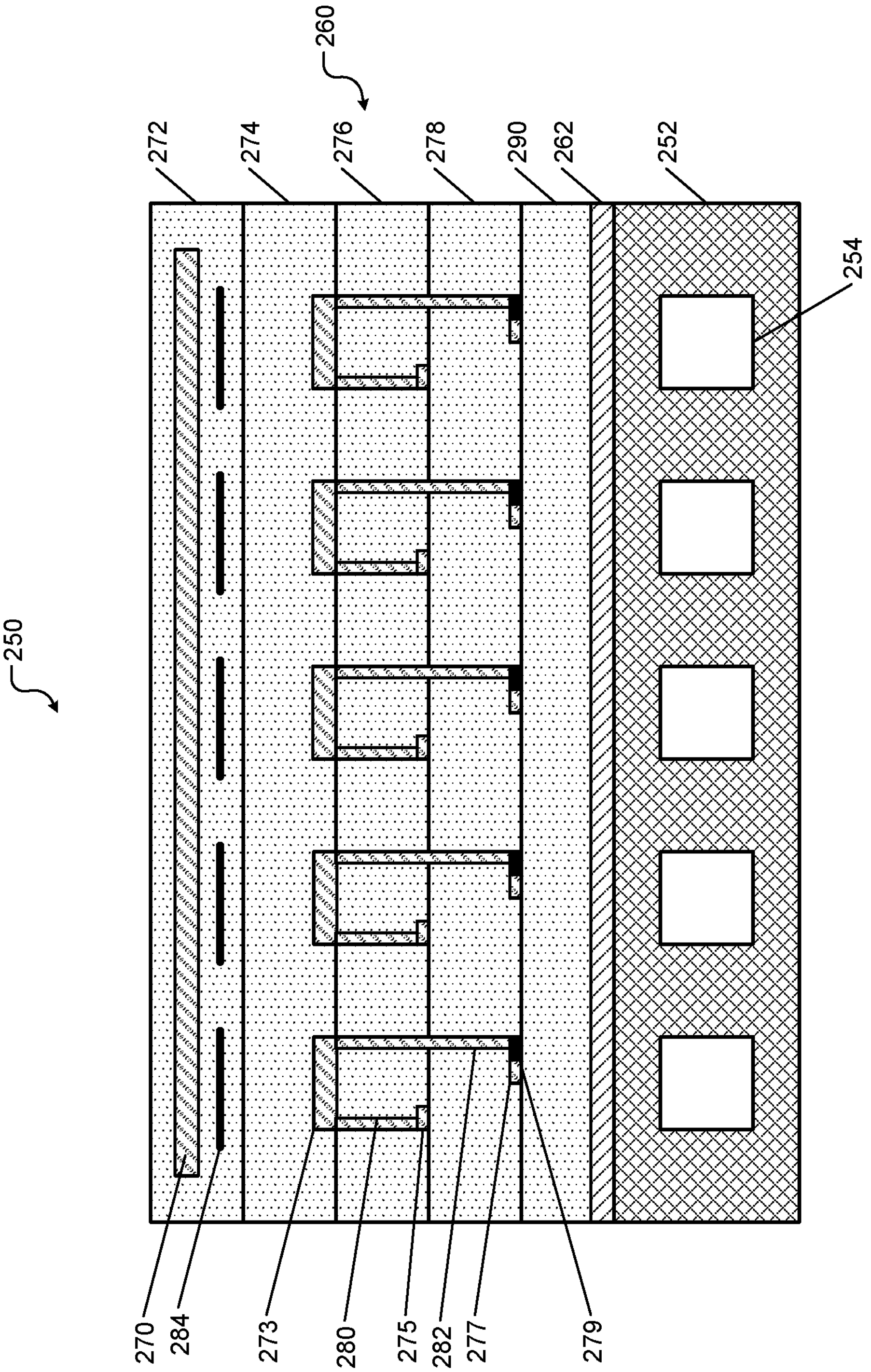
FIG. 2 is a side cross-sectional view of an example of a substrate support assembly comprising electrical components disposed in a ceramic plate of the substrate support assembly.

FIG. 2 shows a cross-sectional view of an example of a substrate support assembly 250 comprising electrical components disposed in a ceramic plate of the substrate support assembly 250. The substrate support assembly 250 comprises a baseplate 252 and a ceramic plate 260. For example, the baseplate 252 is made of a metal such as aluminum. The baseplate 252 is similar to the baseplates 32 and 112 shown in FIGS. 1A and 1B. The ceramic plate 260 is similar to the ceramic plates 33 and 114 shown in FIGS. 1A and 1B. A thermal resistance layer 262 (similar to elements 36 and 116 shown in FIGS. 1A and 1B) may be arranged between the ceramic plate 260 and the baseplate 252. The baseplate 252 includes a cooling system 254 similar to the cooling systems 38 and 118 shown in FIGS. 1A and 1B.

The ceramic plate 260 includes several stacked layers of a ceramic material. A clamping electrode 270 is disposed in a first layer 272, which is the top layer on which a substrate (e.g., element 34 or 108 shown in FIGS. 1A and 1B) is arranged during processing. A plurality of heaters 273 are arranged in the form of a matrix or an array in a second layer 274 under the first layer 272. A first set of conductors 275 are disposed in a third layer 276. A second set of conductors 277 and switches (e.g., diodes) 279 are arranged in a fourth layer 278. First terminals of the switches 279 are directly connected to the second set of conductors 277. Vias 280 connect first terminals of the heaters 273 directly to the first set of conductors 275. Vias 282 connect second terminals of the heaters 273 to the second terminals of the switches 279.

One or more additional zone heaters (also called primary heaters) 284 may be arranged in the ceramic plate 260. For example, the zone heaters 284 can be arranged above the heaters 273 and under the clamping electrode 270 (e.g., in the first layer 272). Alternatively, the zone heaters 284 can be arranged under the heaters 273 (e.g., in a fifth layer 290 of the ceramic plate 260). While not shown, one or more temperature sensors can be disposed in one or more layers of the ceramic plate 260. Electrical connections to these components in the ceramic plate 260 are shown and described with reference to FIGS. 6A-6D.

Figure 3:
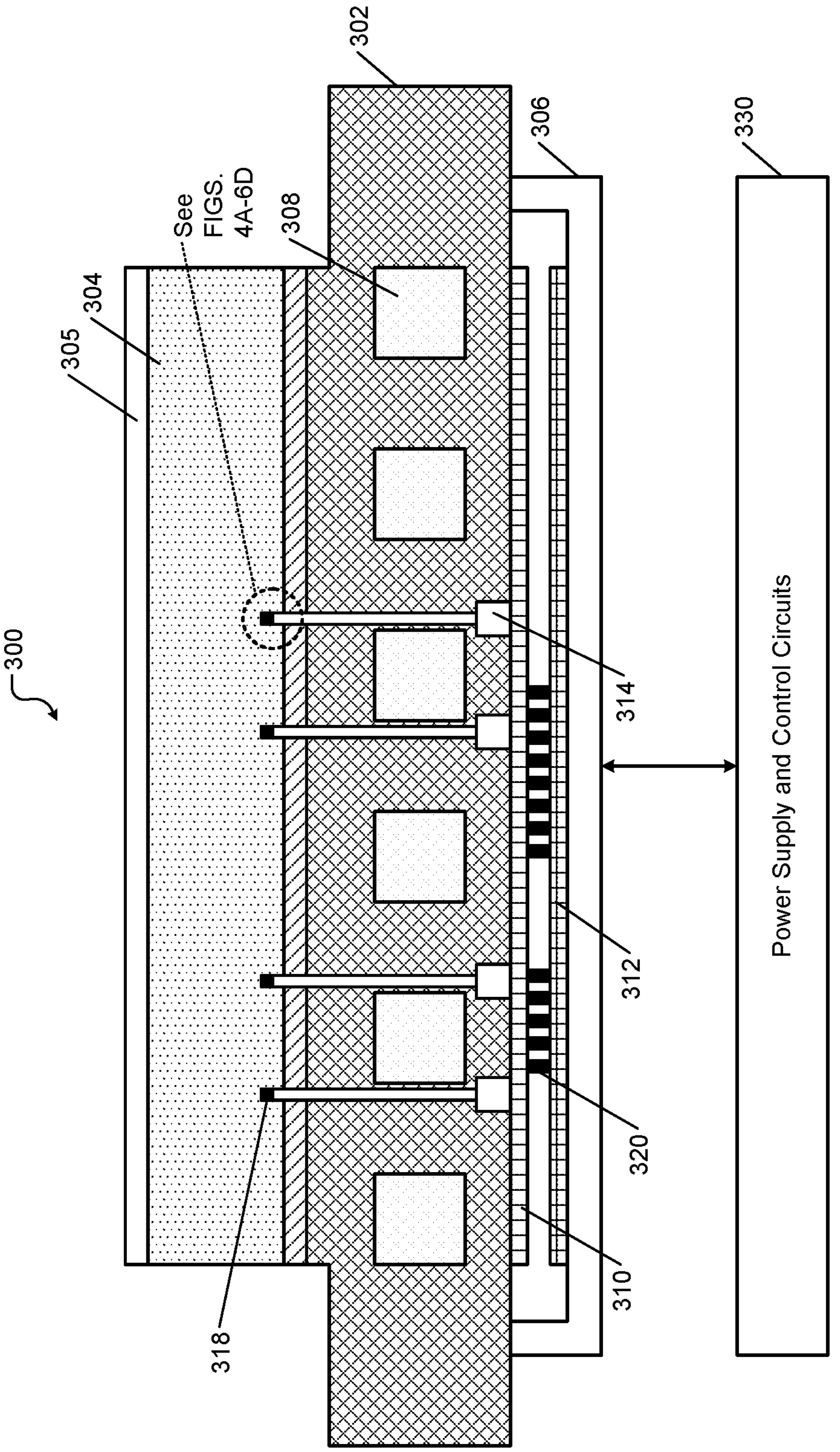
FIG. 3 is a side cross-sectional view of another example of a substrate support assembly comprising a printed circuit board fixed to a baseplate of the substrate support assembly.

FIG. 3 shows an example of a substrate support assembly 300 comprising PCBs fixed to the substrate support assembly 300 and a facility plate 306. The substrate support assembly 300 comprises a baseplate 302, a heating plate 304, a ceramic plate 305, and the facility plate 306. The baseplate 302 includes a plurality of cooling channels 308. The heating plate 304 includes a main heater (e.g., element 284 shown in FIG. 2) and a plurality of micro heaters (e.g., elements 273 shown in FIG. 2). One or more temperature sensors (not shown) are disposed in the ceramic plate 305 and the baseplate 302.

In the example shown, a first PCB 310 is fixed to the bottom of the baseplate 302. A second PCB 312 is fixed to the facility plate 306. The first PCB 310 includes electrical connections to the heaters and sensors and includes power and signal distribution hardware. The second PCB 312 interfaces with the first PCB 310 and is also called a multiplexer or a MUX PCB. The second PCB 312 is connected to a power supply and control circuit 330.

The power supply and control circuit 330 supplies power to the second PCB 312. The first PCB 310 receives the power from the second PCB 312 and supplies the power to the heaters in the heating plate 304. The first PCB 310 receives signals from the temperature sensors. The second PCB 312 receives the signals from the first PCB 310 and supplies the signals to the power supply and control circuit 330. The power supply and control circuit 330 controls the power to the heaters in the heating plate 304 and the flow of coolant through the cooling channels 308 based on the signals from the temperature sensors disposed in the ceramic plate 305 and the baseplate 302.

The first PCB 310 and the second PCB 312 are connected to each other by a plurality of spring loaded pin connections 320. The pin connections 320 are arranged on the second PCB 312. The first PCB 310 includes a plurality of pads (not shown). The tips of the pin connections 320 contact the corresponding pads on the first PCB 310.

A plurality of metallic terminals 318 are disposed at the bottom of the ceramic plate 305. The terminals 318 are shown and described with reference to FIGS. 4A-6D (as elements 400 and 500). The terminals 318 are connected to the various electrical components (e.g., heaters, sensors, electrodes) disposed in the ceramic plate 305. Examples of the components are already shown in FIG. 2 and are omitted here to illustrate connections of the components to the PCBs. Wires, which are also shown and described with reference to FIGS. 4A-6D (as elements 408 and 508), are connected to the terminals 318. The wires are routed through the base plate 302 and are connected to the first PCB 310 at 314.

Figure 4A:
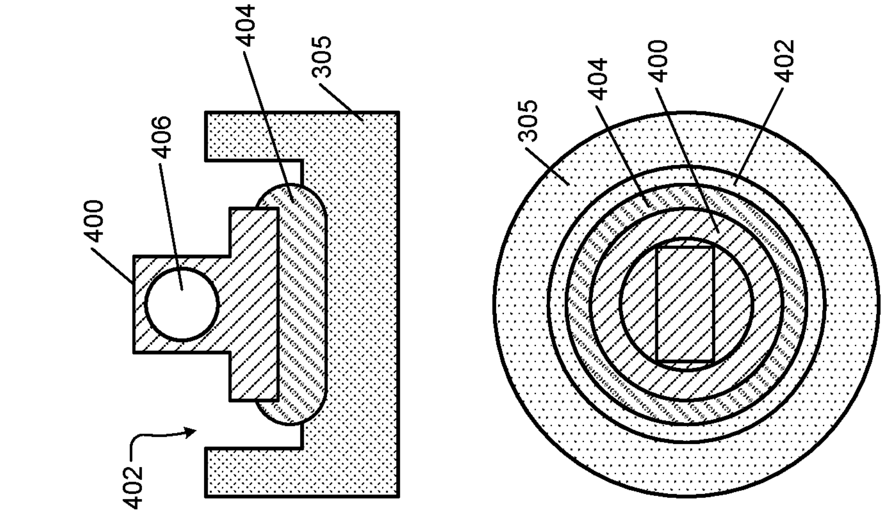
FIGS. 4A-4C show cross-sectional and top views of an example of a metallic terminal disposed in a ceramic plate of a substrate support assembly and a wire connected to the terminal.
Figure 4B:
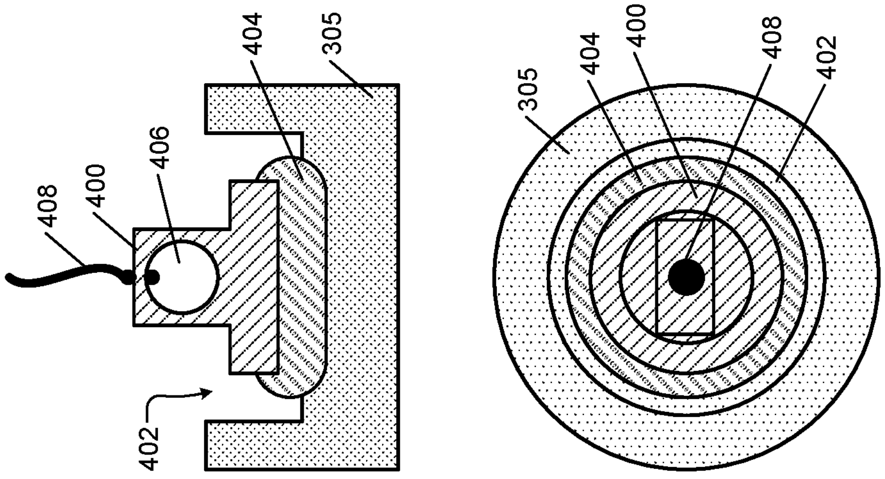
Figure 4C:
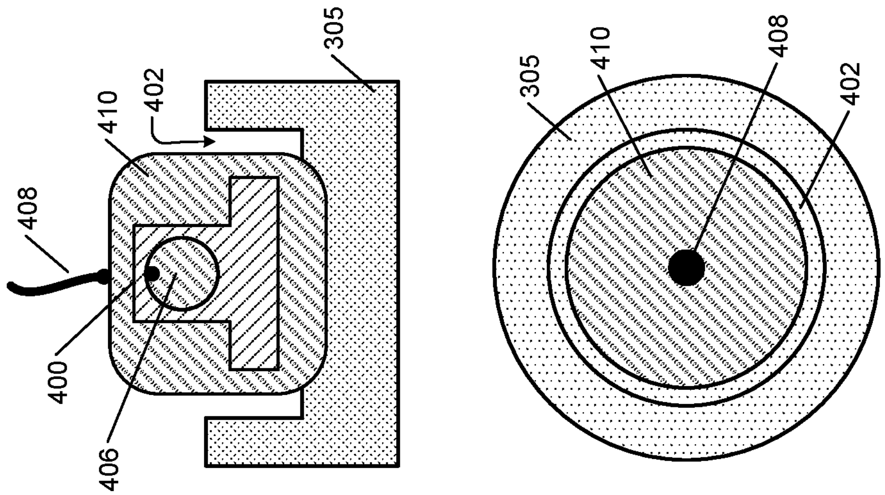

FIGS. 4A-4C show cross-sections of a portion of the ceramic plate 305 shown in a dotted circle in FIG. 3, which includes the terminal 318 and a wire connected to the terminal 318. All elements are shown inverted (i.e., downside up). That is, in use, the ceramic plate 305 mounted facing down instead of facing up as shown, and the terminal and the wire extend downward instead of upward as shown. Below each cross-section, a top view is shown.

In FIG. 4A, a metallic terminal 400 is disposed in a slot 402 at the bottom of the ceramic plate 305 (again, shown downside up). A plurality of the terminal 400 is disposed in respective slots 402 at the bottom of the ceramic plate 305. For example only, the terminal 400 is shown as being T-shaped. The terminal 400 can be of any other shape. Further, for example only, a leg (i.e., a vertical portion) and a base (i.e., a horizontal portion) of the T-shaped terminal 400 are shown as being cylindrical. These elements of the terminal 400 can be of any other shape. Non-limiting examples of the other shapes include hexagonal, square, rectangular, triangular, and so on. The shapes of the slots 402 can be similar to the shapes of the terminals 400.

The base portion of the terminal 400 is soldered to a conductor (not shown) disposed in the ceramic plate 305 using reflow process. The solder material is shown at 404. The conductor is connected to a component (e.g., a heater, a sensor, or an electrode; see FIG. 2) in the ceramic plate 305. By soldering the terminal 400 to the conductor in the ceramic plate 305, the terminal 400 is connected to a component (e.g., a heater, a sensor, or an electrode) in the ceramic plate 305.

The vertical portion of the terminal 400 includes an opening (or a through hole) 406 through which a wire 408 is threaded as shown in FIG. 4B. In FIG. 4C the wire 408 is soldered to the terminal 400 using hand solder or reflow process as described above. The solder material is schematically shown at 410. The size and shape of the solder material 410 shown is not actual and is for illustrative purposes only. The soldering processes pose several challenges mentioned above. Further, the manual nature of these processes cause manufacturing variability leading to frequent wire detachment problems and scrapping of the entire substrate support assembly.

Figure 5C:
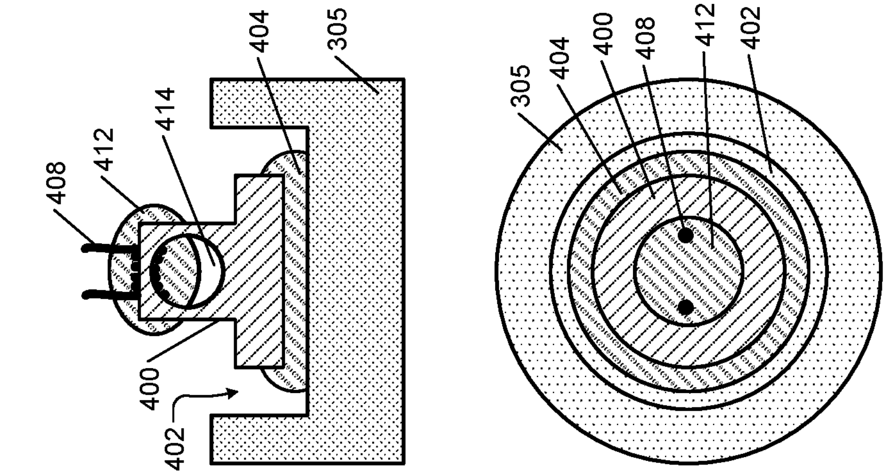
FIGS. 5A-5C show cross-sectional and top views of an example of a metallic terminal disposed in a ceramic plate of a substrate support assembly and a wire connected to the terminal by looping the wire around an opening in the terminal.
Figure 5B:
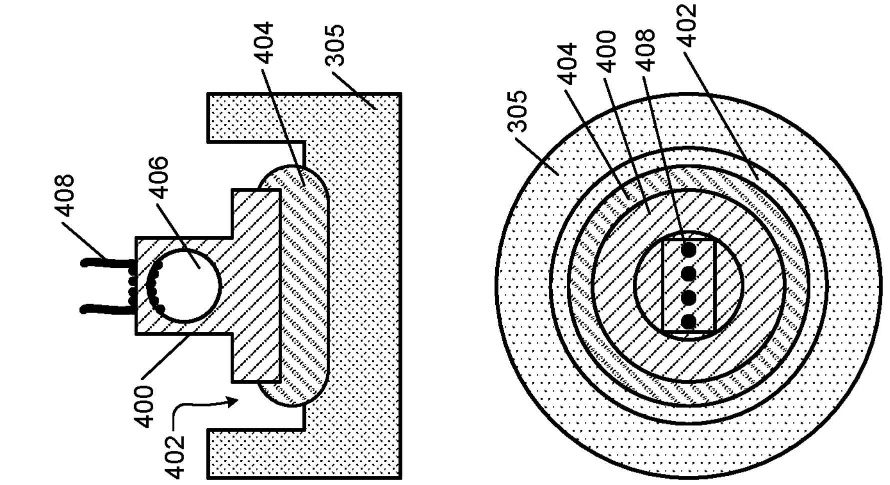
Figure 5A:
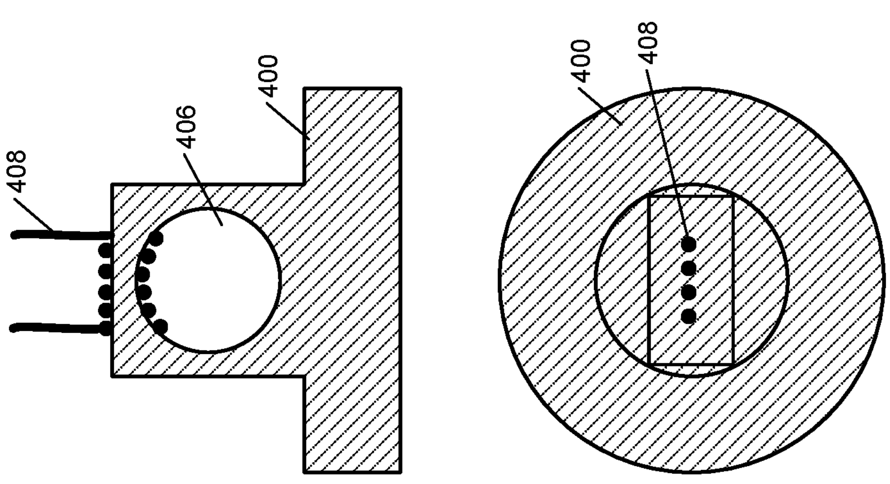

FIGS. 5A-5C show how the wire 408 can be looped one or more times after the wire 408 is threaded through the opening 406 to alleviate the wire detachment problems. Again, all elements are shown inverted (i.e., downside up), and a top view is shown below each cross-section.

In FIG. 5A, the wire 408 is threaded through the opening 406 and looped one or more times around the opening 406 at the distal end of the vertical portion of the terminal 400. The wire 408 is threaded after the terminal 400 is soldered to the ceramic plate 305 as shown and described below with reference to FIG. 5B.

In FIG. 5B, the base portion of the terminal 400 is arranged in the slot 402 in the ceramic plate 305 and is soldered to a conductor (not shown) disposed in the ceramic plate 305 using reflow process. The solder material is shown at 404. The conductor is connected to a component (e.g., a heater, a sensor, or an electrode; see examples in FIG. 2) in the ceramic plate 305. By soldering the terminal 400 to the conductor in the ceramic plate 305, the terminal 400 is connected to a component (e.g., a heater, a sensor, or an electrode) in the ceramic plate 305.

In FIG. 5C, the wire 408, which is threaded and looped as shown and described above with reference to FIG. 5A, is or is not soldered to the terminal 400 using hand solder or reflow process as described above. The solder material is schematically shown at 412. The size and shape of the solder material 412 is not actual and is for illustrative purposes only.

In FIG. 5C, the wire 408, which is threaded and looped as shown and described above with reference to FIG. 5A, can be reinforced with a conductive epoxy so the mechanical and electrical contact is enhanced with the terminal 400. The conductive epoxy material is schematically shown at 412. The size and shape of the conductive epoxy 412 is not actual and is for illustrative purposes only.

In this design of the terminal 400, the solder material 412 tends to spread and cover the opening 406 almost entirely, often leaving only a small gap 414 in the opening 406 unfilled with the solder material 412. In some instances, the solder material 412 can flow further and contact the base portion of the terminal 400 without leaving the gap 414. This spreading of the solder material 412 allows heat to transfer from the base portion of the terminal 400, which conducts heat from the ceramic plate 305, to the distal end of the vertical portion of the terminal 400 and to the wire 408. The heat transfer from the ceramic plate 305 to the wire 408 can adversely affect the thermal uniformity and mechanical stability of the connection of the wire 408 to the terminal 400.

FIGS. 6A-6D show an example of a design of the terminal and the manner of connecting a wire to the terminal according to the present disclosure. The design solves the initial manufacturing problems as well as the subsequent wire detachment problems described above. Specifically, the terminal includes an elongated opening in the vertical portion of the terminal and therefore functions as a thermal choke that thermally decouples the wire from the ceramic plate. The wire is looped around the opening of the terminal at the distal end of the vertical portion of the terminal one or more times and then twisted. The looping and twisting of the wire ensures mechanical stability and electrical contact of the wire with the terminal. Optionally, while unnecessary due to the looping and twisting of the wire, the electrical contact can be further reinforced and enhanced using solder or a conductive epoxy. The solder or epoxy can be deposited using the process described below with reference to FIGS. 7A and 7B such that the solder or epoxy does not diminish the thermal choke property of the terminal, and the wire remains thermally decoupled from the ceramic plate.

Figure 6A:
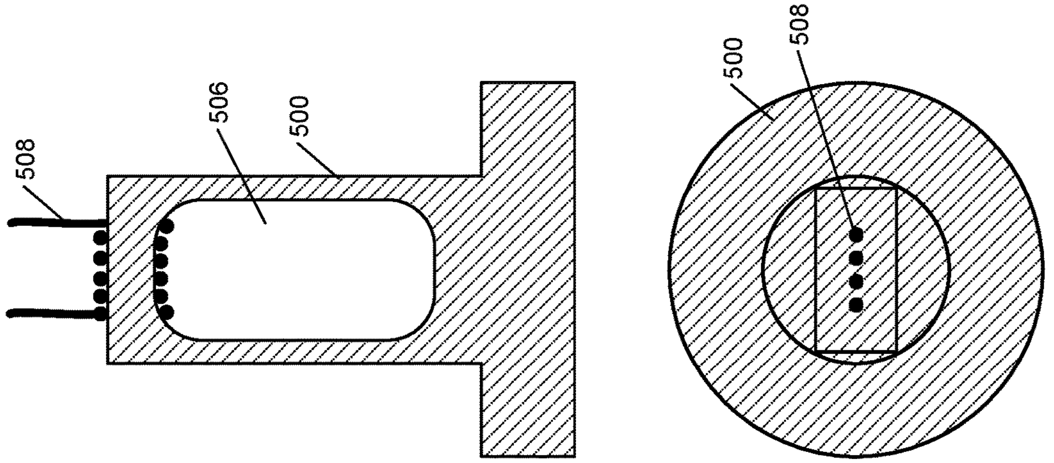
FIG. 6A is a side cross-sectional view of an example of a metallic terminal including an elongated opening with a wire looped around the opening according to the present disclosure.

FIG. 6A shows a terminal 500 that is similar to the terminal 400 except the opening 506 of the terminal 500 is elongated along the length of the vertical portion of the terminal 500. The size and shape of the opening 506 as shown is for illustrative purposes only, and other sizes and shapes are contemplated. Non-limiting examples of such shapes include oval and oblong shapes, rectangular shape, and so on. The vertical portion of the terminal 500 is longer than the base portion of the terminal 500. The opening 506 extends along the length of the vertical portion of the terminal 500 from a point where the vertical portion begins extending from the base portion to a distal end of the vertical portion.

For example only, the terminal 500 can be T-shaped. For example only, the base portion and the vertical portion of the terminal can be cylindrical, the vertical portion extends perpendicularly from the base portion, and the base portion has a longer radius (i.e., larger diameter) and shorter height than the vertical portion. Instead, similar to the terminal 400, the terminal 500 can be of any other shape as described above with reference to the terminal 400, the description of which is not repeated for brevity.

The terminal 500 is made of a material having a coefficient of thermal expansion (CTE) that closely matches the CTE of the ceramic plate 305. Specifically, the terminal 500 is made of a material having a first CTE that is within a predetermined range of a second CTE of the ceramic plate 305. For example, the terminal 500 is made of a mixture of tungsten and copper. Further, the terminal 500 may be coated with nickel to facilitate and enhance bonding of solder material to the terminal 500. A wire 508 is threaded and looped around the opening 506 as described below with reference to FIG. 6B. The wire 508 is twisted as shown and described below with FIG. 6C.

Figure 6B:
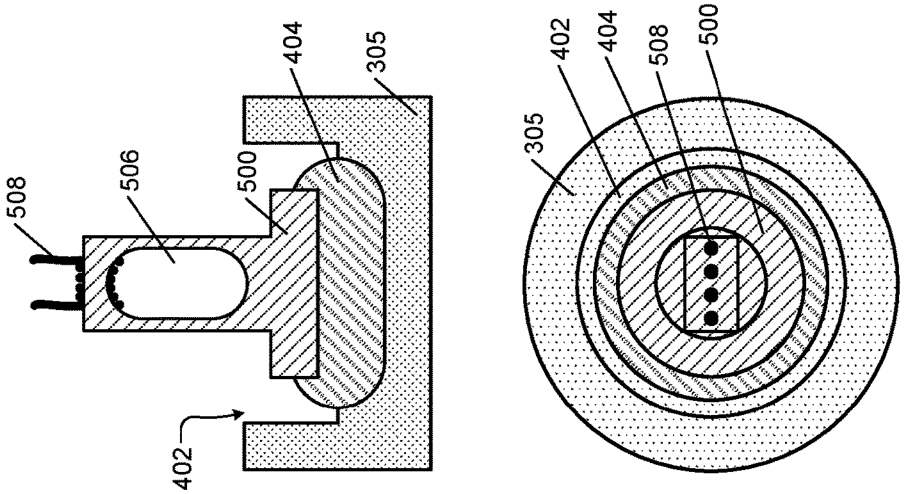
FIG. 6B is a side cross-sectional view of the metallic terminal of FIG. 6A disposed in a ceramic plate of a substrate support assembly.

In FIG. 6B, the terminal 500 is disposed in the slot 402 in the ceramic plate 305. The base portion of the terminal 500 is soldered to the ceramic plate 305 similar to the terminal 400 using reflow process. The solder material is shown at 404. The wire 508 is threaded through the opening 506 and folded such that the folding point is in the middle (i.e., near the center of the length) of the wire 508. Accordingly, two half portions of the wire 508 extend from the distal end of the vertical portion of the terminal 500. These two half portions of the wire 508 are looped around the opening 506 and the distal end of the vertical portion of the terminal 500 as explained below and then twisted as shown in FIG. 6C to ensure mechanical stability and electrical contact of the wire 508 with the terminal 500.

In FIG. 6B, after threading and folding the wire 508 and before twisting the wire 508, the wire 508 is looped or wound around the opening 506 of the terminal 500 as follows. For example, the wire 508 can be looped one or more times around the opening 506. In some examples, the wire 508 is looped at least a plurality of times around the opening 506. In some examples, instead of or in addition to looping, the wire 508 may be tied one or more times around the opening 506 using a simple knot. Any type of knot may be used. For example, any type of knot used to tie shoelaces may be used. In some examples, one or more knots may be tied around the opening 506 before or after looping the wire 508 one or more times around the opening 506. In some examples, a combination of one or more knots and one or more loops may be used in any order. The looping (and/or knotting) followed by twisting of the wire 508 around the opening 506 ensures mechanical stability and electrical contact of the wire 508 with the terminal 500.

For example, the wire 508 may be a single strand wire or a multi-strand wire. The gage of the wire 508 may depend on current to be supplied through the wire 508. For example, the wire 508 used to supply power to the heaters may be of a thicker gage than the wire 508 connected to a temperature sensor. The material of the wire 508 is malleable so that the wire 508 does not break due to mechanical stress during looping/knotting and twisting of the wire 508. For example, the wire 508 may be made of silver coated copper.

Since the wire 508 looped and/or knotted around the opening 506 at the distal end of the vertical portion of the terminal 500 does not contact the base portion of the terminal 500 and is thermally decoupled from the base portion of the terminal 500 due to the elongated opening 506, only a relatively small amount of the heat conducted by the base portion of the terminal 500 from the ceramic plate 305 is conducted to the wire 508 during substrate processing. For example, while the temperature of the ceramic plate 305 may be about 200 degrees Celsius, the temperature of the wire 508 may be about 70 to 80 degrees Celsius. In other words, only about a third (or about 35%) of the heat conducted by the base portion of the terminal 500 from the ceramic plate 305 is conducted to the wire 508 during substrate processing. Thus, the terminal 500 thermally decouples the wire 508 from the ceramic plate 305; and the terminal 500, with the elongated opening 506, acts as a thermal choke.

Due to the lower or partial amount of heat transferred from the ceramic plate 305 to the wire 508 during substrate processing, the heat from the ceramic plate 305 does not adversely affect the connection of the wire 508 to the terminal 500. Consequently, the connection between the wire 508 and the terminal 500 remains intact without any wire detachment issues arising during the lifetime of the substrate support assembly. Since the wire 508 removes a limited amount of heat from ceramic plate 305, this design provides an additional benefit of enhanced thermal uniformity of the ceramic plate 305

In FIG. 6C, the two half portions of the wire 508 are twisted (i.e., braided) as shown. The twisting operation may be performed using a drill, electrical screwdriver, or a dedicated wire twister. The twists in the wire 508 extend from the ends of the wire 508 to the distal end of the vertical portion of the terminal 500 where the wire 508 is looped around the opening 506. The looping and twisting ensure the mechanical stability and the electrical contact of the wire 508 with the terminal 500.

The distal end of the wire 508 is routed through a baseplate (e.g., element 302 shown in FIG. 3) and is connected to a circuit (e.g., element 310 shown in FIG. 3). The circuit communicates through the wire 508 and the terminal 500 with a component (e.g., a heater, sensor, or electrode shown in FIG. 2) that is connected to the base portion of the terminal 500.

Figure 6D:
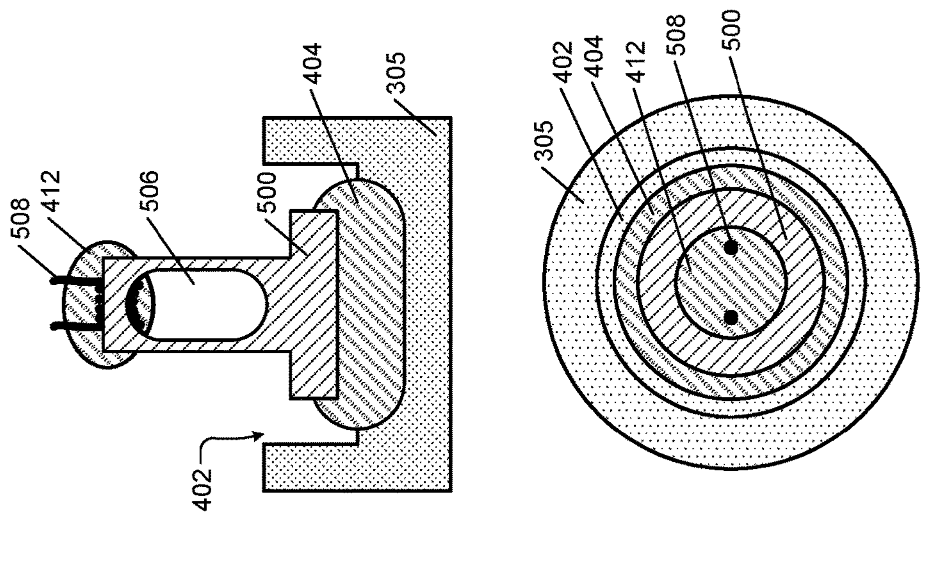
FIG. 6D shows the twisted wire soldered to the terminal according to the present disclosure.
Figure 6C:
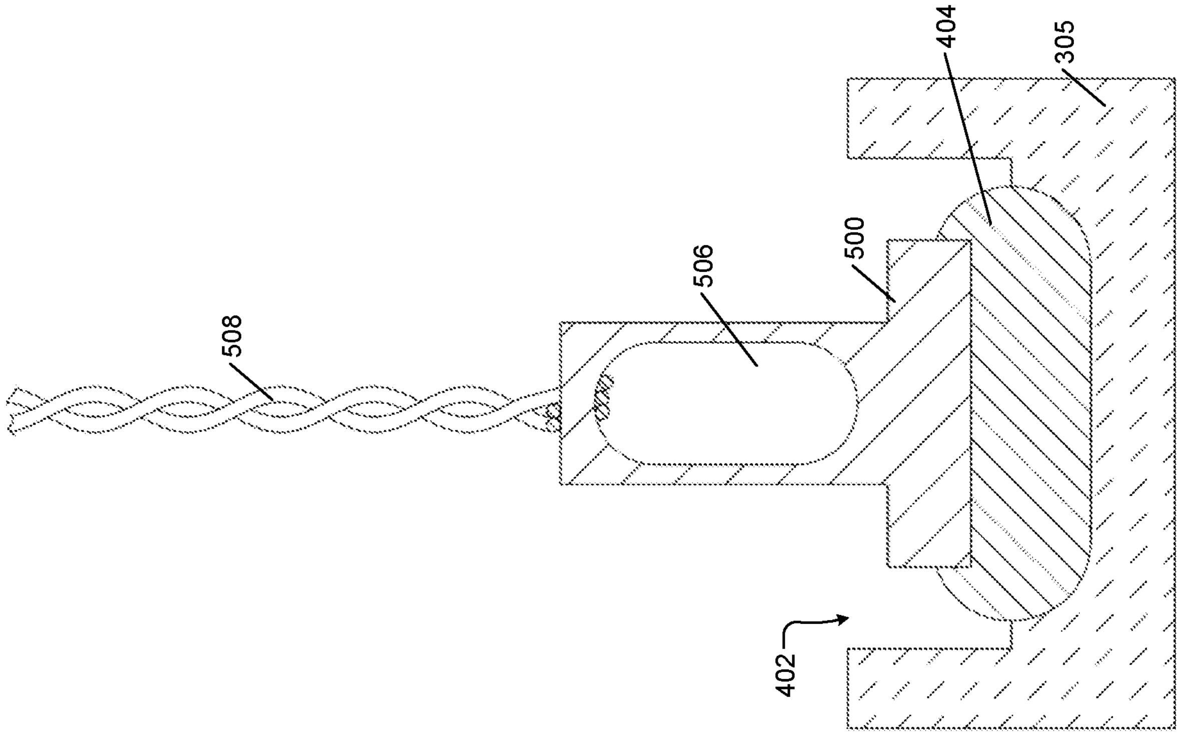
FIG. 6C shows the wire in FIG. 6B twisted according to the present disclosure.

In FIG. 6D, an electrically bonding material 512 such as solder and/or conductive epoxy can be optionally deposited at the point of contact of the wire 508 and the terminal 500 to reinforce mechanical stability and enhance electrical contact of the wire 508 with the terminal 500. The material 512 is shown schematically. The size and shape of the material 512 is not actual and is for illustrative purposes only.

Since the contact of the wire 508 with the terminal 500 is already firm due to the looping and/or knotting and the twisting of the wire 508 around the opening 506, only a small amount of the material 512 need be used. For example, when used, the material 512 can be deposited by hand soldering at relatively lower temperatures as described below with reference to FIG. 7A. Alternatively, reflow process can be used as described below with reference to FIG. 7B.

Further, since the material 512 is sparingly used, the material 512 does not spread/flow towards the base of the terminal 500 and does not fill the opening 506. For example, at least 80-90% of the opening 506 is free of the material 512. The material 512 remains localized at the point of contact between the wire 508 and the terminal 500 (i.e., around the distal end of the vertical portion of the terminal 500). Consequently, the terminal 500 continues to operate as a thermal choke, and the wire 508 remains thermally decoupled from the ceramic plate 305 after depositing the material 512.

Figure 7B:
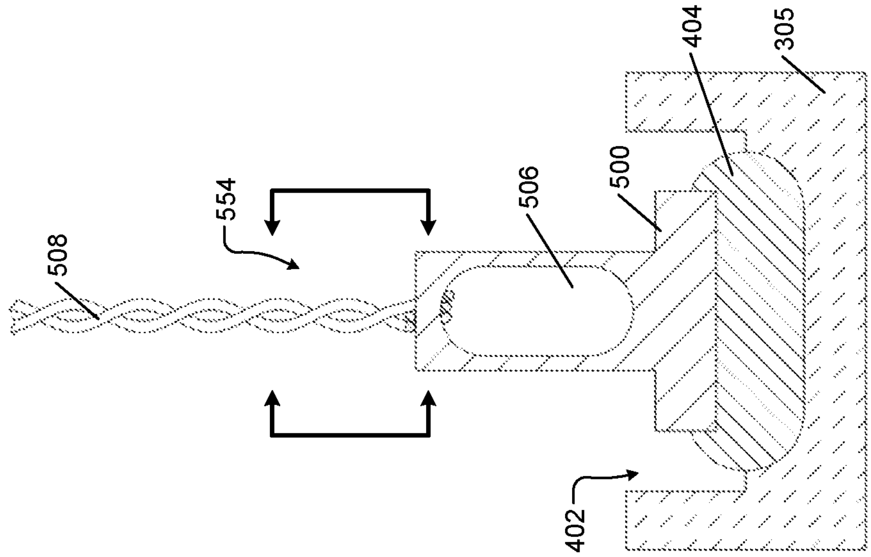
FIG. 7B shows soldering of the twisted wire to the terminal using reflow process according to the present disclosure.
Figure 7A:
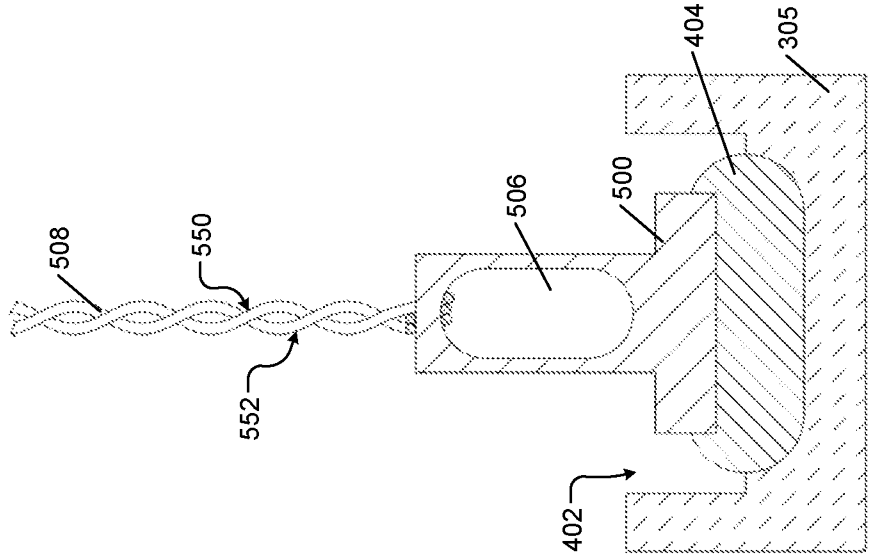
FIG. 7A shows soldering of the twisted wire to the terminal using hand soldering according to the present disclosure.

FIGS. 7A and 7B show examples of methods for soldering the wire 508 to the terminal 500 after the looping/knotting and twisting the wire 508 around the opening 506 as described above. FIG. 7A shows an example of hand soldering. FIG. 7B shows an example of reflow process. Either method joins the wire 508 with the terminal 500 as shown in FIG. 6D.

In FIG. 7A, a soldering iron is used to solder the wire 508 to the terminal 500. A tip of the soldering iron is positioned proximate to (e.g., about 1-2 cm above) the top end of the vertical portion of the terminal 500 (e.g., at 550). A bit of solder is placed on the tip to warm up the wire 508 proximate to (e.g., about 1-2 cm above) the top end of the vertical portion of the terminal 500 (e.g., at 550). A solder wire is placed in contact with the wire 508 near the top end of the vertical portion of the terminal 500 below the tip (e.g., at 552).

As the solder wire melts, the solder wire is pushed into the wire 508 to infiltrate or permeate the wire 508 until the solder reaches the top end (i.e., the distal end) of the vertical portion of the terminal 500. The soldering is continued until the loop/knot of the wire 508 around the opening 506 of the terminal 500 is infiltrated or permeated by the solder. At this point, the soldering of the wire 508 to the terminal 500 is complete, and the wire 508 is joined to the terminal 500 as shown in FIG. 6D. For example, the solder wire can include SAC305 (96.5% Sn+3.0% Ag+0.5% Cu) or Sn3.5Ag (96.5% Sn+3.5% Ag) solder.

In FIG. 7B, a paste of a solder material (e.g., SAC305) is applied to a portion 554 of the wire 508 above the top end of the vertical portion of the terminal 500 and to the top end (i.e., the distal end) of the vertical portion of the terminal 500. Care is taken that the solder paste does not reach all the way to the base portion of the terminal 500. Subsequently, the ceramic plate is placed in a reflow oven, and reflow process is performed at appropriate temperature so that the solder paste is melted. At this point, the loop/knot of the wire 508 around the opening 506 of the terminal 500 is infiltrated or permeated by the solder, and the soldering of the wire 508 to the terminal 500 is complete, and the wire 508 is joined to the terminal 500 as shown in FIG. 6D.

The foregoing description is merely illustrative in nature and is not intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another are within the scope of this disclosure.

Spatial and functional relationships between elements (for example, between modules, circuit elements, semiconductor layers, etc.) are described using various terms, including "connected." "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B. and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a pedestal, a gas flow system, etc.). These systems may be integrated with electronics for controlling their operation before, during, and after processing of a semiconductor wafer or substrate. The electronics may be referred to as the "controller," which may control various components or subparts of the system or systems.

The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software).

Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process.

In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control.

Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A substrate support assembly comprising:

a baseplate;

a ceramic plate arranged on the baseplate, wherein the ceramic plate includes:

a plurality of slots arranged on a side facing the baseplate; and a plurality of electrically conducting terminals disposed in the plurality of slots, respectively;

wherein each of the terminals includes:

a base portion connected to the ceramic plate;

a second portion extending from the base portion towards the baseplate; and an opening in the second portion extending from an end of the second portion adjacent to the base portion to a distal end of the second portion; and a plurality of wires, wherein each of the wires passes through the opening of the respective terminal and is braided around the distal end of the second portion of the respective terminal.

2. The substrate support assembly of claim 1 wherein each of the wires is looped one or more times around the distal end of the second portion of the respective terminal.

3. The substrate support assembly of claim 1 further comprising an electrically bonding material deposited at the distal end of the second portion of each of the terminals.

4. The substrate support assembly of claim 1 wherein the openings of the terminals thermally decouple the respective wires from the ceramic plate during processing of a substrate.

5. The substrate support assembly of claim 3 wherein the electrically bonding material includes a solder material or an epoxy.

6. The substrate support assembly of claim 3 wherein the electrically bonding material is localized at the distal end of the second portion of each of the terminals.

7. The substrate support assembly of claim 3 wherein the electrically bonding material does not extend to the base portions of the terminals.

8. The substrate support assembly of claim 3 wherein the electrically bonding material does not fill the openings of the terminals.

9. The substrate support assembly of claim 1 wherein the base portions of the terminals are connected to electrical components disposed in the ceramic plate.

10. The substrate support assembly of claim 1 wherein the distal ends of the wires are routed through the baseplate and are connected to a circuit arranged along a side of the baseplate facing away from the ceramic plate.

11. The substrate support assembly of claim 10 wherein the circuit communicates through the wires with electrical components that are disposed in the ceramic plate and that are connected to the base portions of the terminals.

12. The substrate support assembly of claim 1 wherein each of the terminals is T-shaped, with a horizontal portion of T being the base portion of each of the terminals and a vertical portion of T being the second portion of each of the terminals.

13. The substrate support assembly of claim 1 wherein in each of the terminals, the second portion extends perpendicularly from the base portion.

14. The substrate support assembly of claim 1 wherein in each of the terminals, the second portion is longer than the base portion.

15. The substrate support assembly of claim 1 wherein in each of the terminals, the base portion and the second portion are cylindrical, wherein the base portion has a longer radius and shorter height than the second portion.

16. The substrate support assembly of claim 1 wherein each of the terminals is made of a material having a first coefficient of thermal expansion that is within a predetermined range of a second coefficient of thermal expansion of the ceramic plate.

17. The substrate support assembly of claim 1 wherein each of the terminals is made of tungsten and copper.

18. The substrate support assembly of claim 1 wherein each of the terminals is coated with nickel.

19. The substrate support assembly of claim 1 wherein each of the wires is made of a single strand of an electrically conducting material.

20. The substrate support assembly of claim 1 wherein each of the wires is made of multiple strands of an electrically conducting material.

21. The substrate support assembly of claim 1 wherein each of the wires is made of copper and is coated with silver.

22. The substrate support assembly of claim 3 wherein the electrically bonding material includes a first material comprising Sn, Ag, and Cu or a second material comprising Sn and Ag.

* * * * *